United States Patent [19]
Graham et al.

[11] Patent Number: 5,191,300
[45] Date of Patent: Mar. 2, 1993

[54] LOCAL AREA NETWORK AMPLIFIER FOR TWISTED PAIR LINES

[75] Inventors: Martin H. Graham, Berkeley; Anthony J. Ireland, Pleasant Hill; Mark Miller, Oakland; Matthew Taylor, Pleasant Hill, all of Calif.

[73] Assignee: Tutankhamon Electronics, Inc., Pleasant Hill, Calif.

[21] Appl. No.: 883,358

[22] Filed: May 15, 1992

[51] Int. Cl.⁵ .............................................. H03F 3/04
[52] U.S. Cl. ................................... 330/310; 330/304; 330/51
[58] Field of Search ........................ 330/51, 304, 310; 333/28 R; 375/11, 14; 379/340; 381/103

[56] References Cited

U.S. PATENT DOCUMENTS

| | | | |
|---|---|---|---|
| 3,444,474 | 5/1969 | Borenstein et al. | 330/304 |
| 3,568,100 | 3/1971 | Tarbox | 333/28 X |
| 4,565,974 | 1/1986 | Smoot | 330/304 |
| 5,115,213 | 5/1992 | Eguchi | 330/304 X |

OTHER PUBLICATIONS

Brunov et al. "A Broadband Amplifier with Automatic Gain Setting", *Instruments And Experimental Techniques* vol. 18, No. 6, PT. 1, Nov.-Dec. 1975, pp. 1826-1829.

*Primary Examiner*—James B. Mullins
*Attorney, Agent, or Firm*—Blakely, Sokoloff, Taylor & Zafman

[57] ABSTRACT

An amplifier for use with a twisted pair LAN. Each stage of the amplifier provides amplification including higher frequency emphasis for a predetermined length of line. The correct number of stages are automatically activated within the amplifier. Thus a singly configured amplifier may be used for different line lengths.

10 Claims, 4 Drawing Sheets

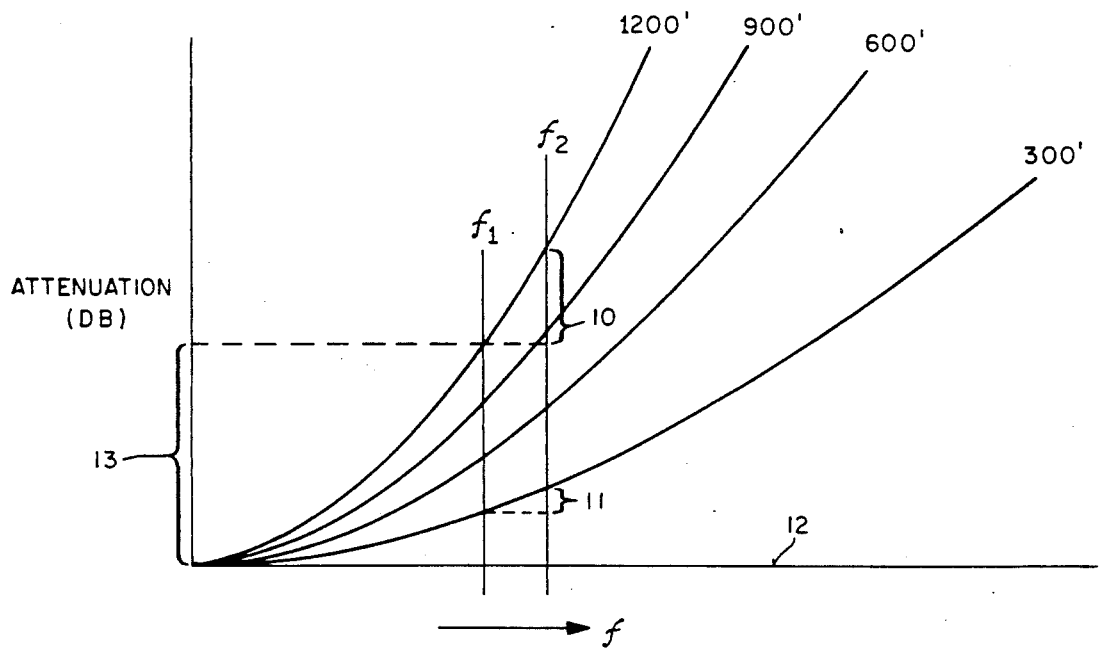
FIG_1
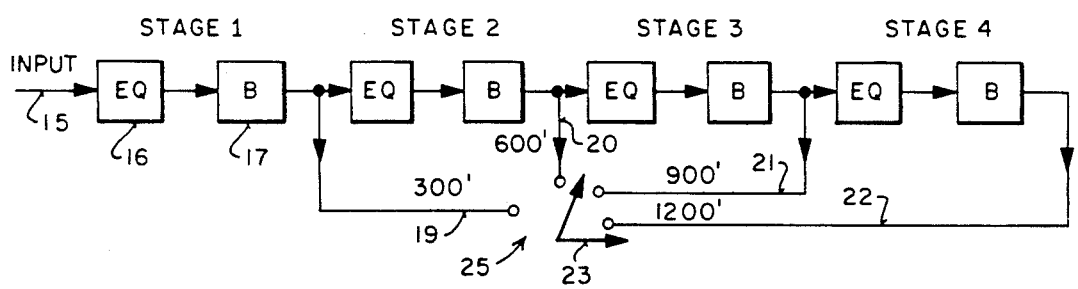
FIG_2
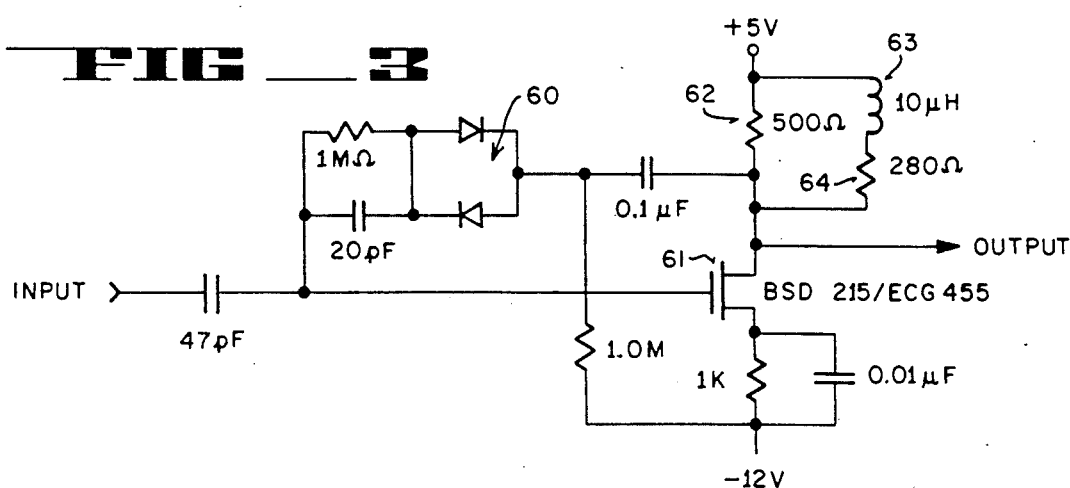
FIG_3

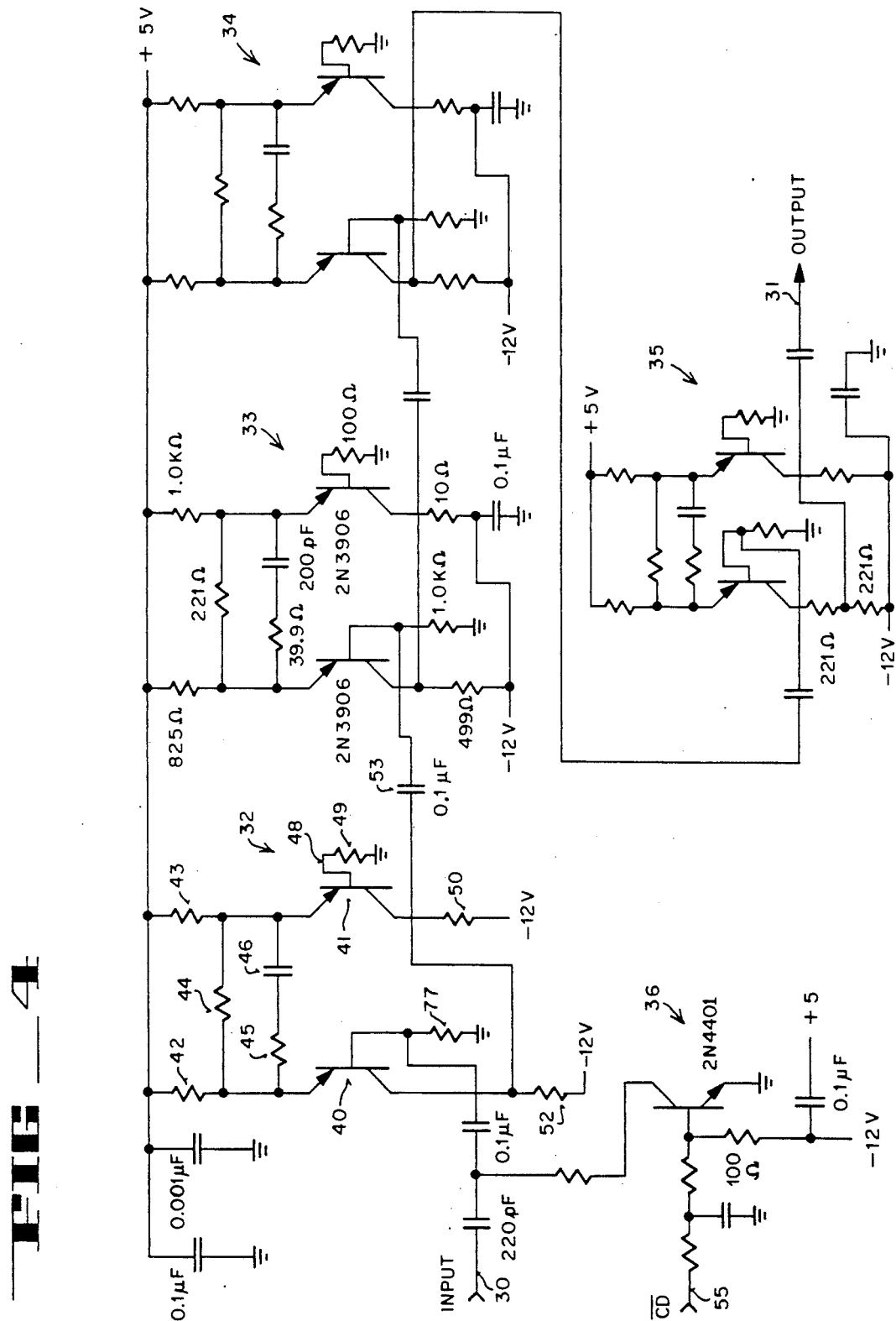
FIG_4

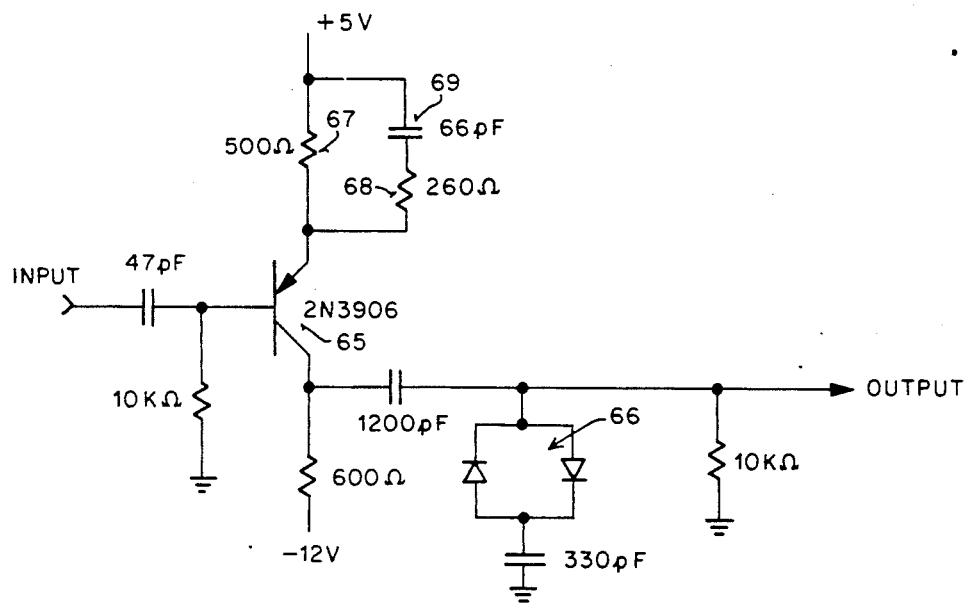
FIG_5
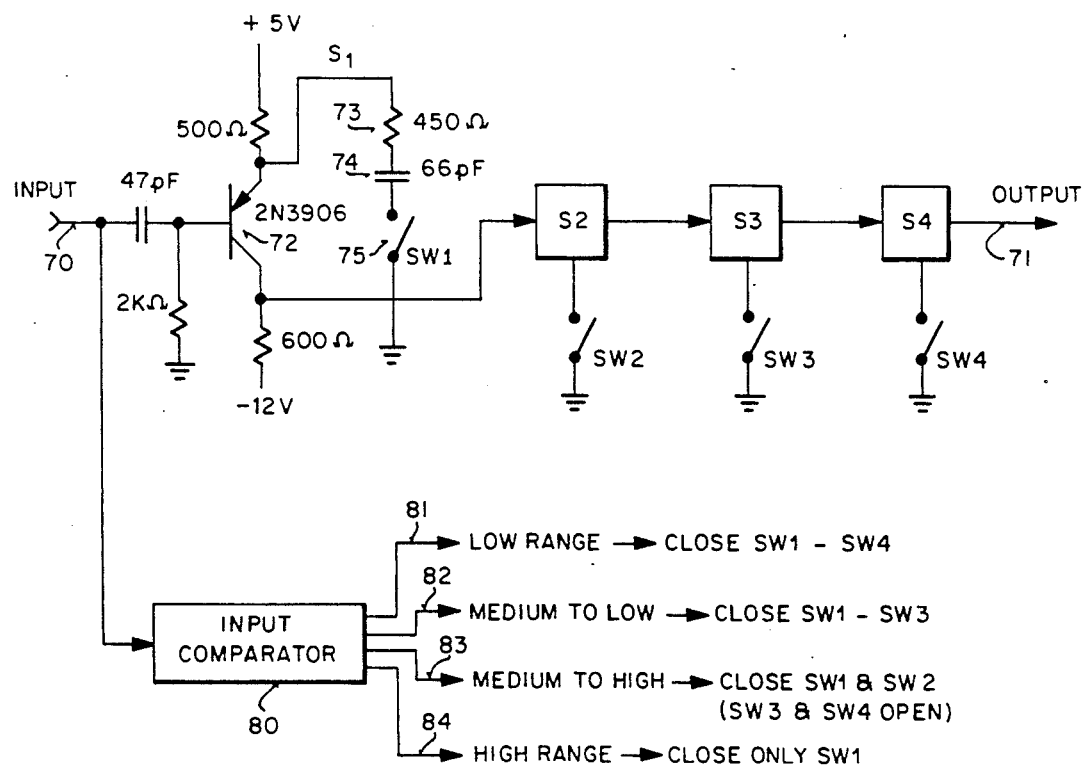
FIG_6

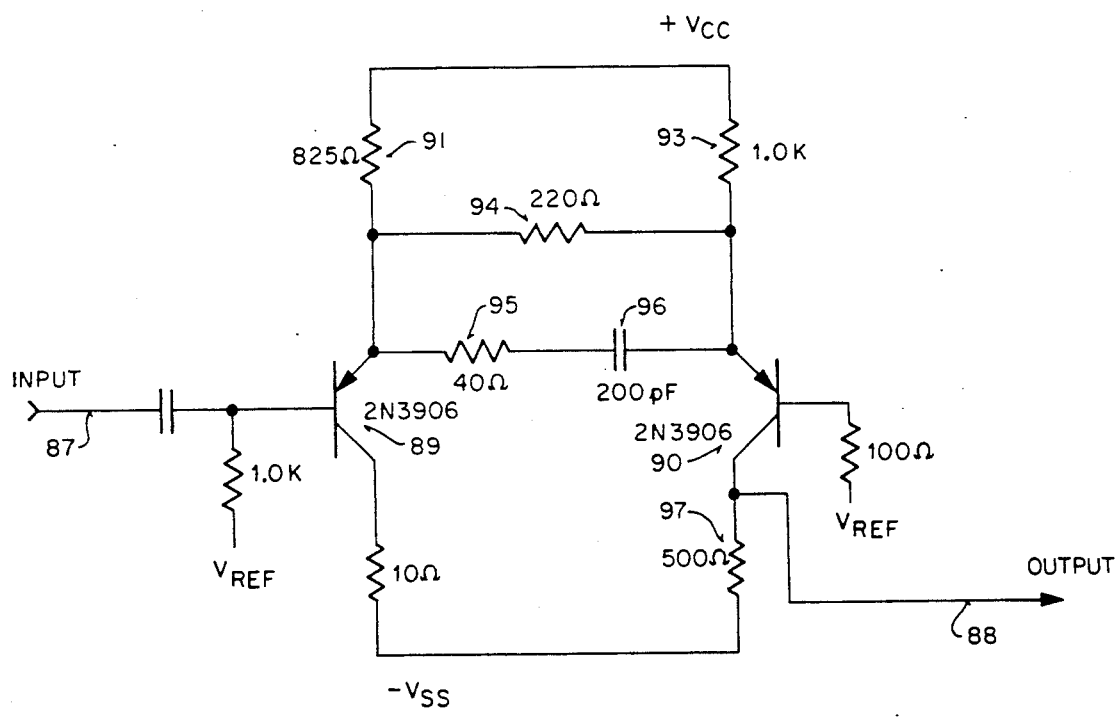
FIG_7

LOCAL AREA NETWORK AMPLIFIER FOR TWISTED PAIR LINES

BACKGROUND OF THE INVENTION

1. Field of the Invention

The invention relates to the field of amplification of data signals in a network such as Ethernet signals in a local area network using standard telephone lines (twisted pairs).

2. Prior Art

Standard telephone lines (twisted pairs) are commonly used in local area networks (LANs). These lines, while not ideal for high frequency signals, are used because they are found in virtually every commercial building.

The typical data rate of signals transmitted in a LAN is substantially higher than the frequencies of the audio signals originally intended for transmission on telephone lines. Consequently, the electrical characteristics of the twisted pairs are not ideal for higher frequency signals. These lines exhibit higher attenuation as the frequency rises. For example, a hundred feet of telephone line might have a loss of 2 dB at 5 MHz and a loss of 3 dB at 10 MHz. This frequency-attenuation characteristic causes a propagated signal having a spectrum of energy to undergo distortion in time and amplitude. Often, a signal quantitized in time intervals suffers from intersymbol interference due to this frequency dependency of attenuation. Accordingly, it is not sufficient to just amplify the signal transmitted over such a line with an amplifier having a "flat" response, but rather correction must also be made for the de-emphasis of the higher frequency.

Consider the problem of amplifying a high frequency signal transmitted over 1000 feet of telephone line. If the frequency response of the line is measured, an amplifier can be readily built to amplify the signal. The problem is, however, that each line requires a unique amplifier. Line characteristics can be quantitized to increments (e.g., 300 feet) and a de-emphasis assumed thereby allowing the selection of an appropriate amplifier as a function of line length. But, for example, if an amplifier designed for a 1000 feet run is used at the end of a 500 feet run, a serious problem can result. Specifically, the amplifier will over-emphasize some higher frequencies of the data signal. This will result in distortion which can change one binary state to another in a detected signal.

As will be seen, the present invention solves this problem by providing an amplifier which automatically compensates for line length.

SUMMARY OF THE INVENTION

An amplifier for amplifying a signal transmitted over a line, where the line attenuates higher frequencies more than lower frequencies is described. A plurality of cascaded stages are used, each stage includes a predetermined amplification with higher frequency emphasis. Each stage of the amplifier further is able to pass an input signal to the stages output with substantially no amplification (unity gain) when the input signal to that stage is above a predetermined level. In one embodiment of the present invention, each stage is able to saturate or limit when the input signal reaches a predetermined level. In another embodiment, the peak to peak amplitude of the input signal to the amplifier is examined allowing an estimate to be made of the length of line through which the signal has passed. This estimate is used to activate amplification through an appropriate number of amplifier stages.

Other aspects of the present invention will be apparent from the following Detailed Description.

BRIEF DESCRIPTION OF THE DRAWINGS

FIG. 1 is a graph showing the attenuation which occurs with respect to frequency for twisted pair lines of different lengths.

FIG. 2 is a block diagram showing the overall concept of the present invention.

FIG. 3 is an electrical schematic showing a single stage of an amplifier for for use in the present invention.

FIG. 4 is an electrical schematic showing the currently preferred embodiment of the present invention.

FIG. 5 is an electrical schematic showing another single stage of an amplifier for use in the present invention.

FIG. 6 is an electrical schematic and block diagram of an alternate embodiment of the present invention.

FIG. 7 is an electrical schematic showing yet another single stage of an amplifier for use in the present invention.

DETAILED DESCRIPTION OF THE PRESENT INVENTION

An amplifier particularly suited for a LAN which uses twisted pair lines is disclosed. In the currently preferred embodiment specific details, such as specific circuit element values are set forth in order to provide a thorough understanding of the present invention. It will be obvious, however, to one skilled in the art that the present invention may be practiced without these specific details.

DISCUSSION OF THE PROBLEM SOLVED BY THE PRESENT INVENTION

Referring first to FIG. 1, the graph represents the expected attenuation in a telephone line (twisted pair) for different length lines (i.e., 300 feet, 600 feet, 900 feet and 1200 feet) as a function of frequency. The increased frequency is shown in the direction of the arrow along the abscissa 12. Two frequencies, $f_1$ and $f_2$ are shown in FIG. 1 for discussion below.

Assume that data transmission in a network occurs by using several frequencies and phases to encode data ($f_1$, $f_2$, ... $f_n$). For example, in an Ethernet network $f_1$ is equal to 5 MHz and $f_2$ to 10 MHz. If one is to amplify the signal at the end of a line, the amplification needed is a function of line lengths. Using too much amplification can cause distortion. For instance, assume that an amplifier which provides the correct amplification for 1200 feet of line is used at the end of 300 feet of line. This amplifier will provide the amplification needed to correct for the attenuation 13 for $f_1$ and additional amplification indicated by the attenuation 10 for the frequency $f_2$. When this amplifier is used to amplify the signal at the end of 300 feet of line, the relative amplifications of the frequencies $f_1$ and $f_2$ will be incorrect. Specifically, compare distances 10 and 11 of FIG. 1. This causes distortion in the signal which can result in data errors. Accordingly, to properly amplify the signal after it has been transmitted over a line the length of the line should be known or the attenuation in the line known.

GENERAL PRINCIPLE EMBODIED IN THE PRESENT INVENTION

Referring to FIG. 2, an amplifier is shown having four stages connected in cascade. When all four stages are used, an input signal on line 15 is amplified through the stages and an output signal occurs on tap 22. Each stage includes an equalizing amplifier 16 and a buffer or coupler 17. Each stage provides the needed amplification at the frequency $f_1$ to compensate for the typical loss through 300 feet of telephone line and the emphasis needed to compensate for the typical higher loss at the higher frequency $f_2$. For instance, each stage may provide 6 dB of gain at $f_1$ and 9 dB of gain at $f_2$. In the currently preferred embodiment, each stage provides the gain need to compensate for the anticipated attenuation of an Ethernet signal in 300 to 400 feet of twisted pair telephone line.

In FIG. 2, a tap 19 is used between stages 1 and 2, a tap 20 between stages 2 and 3 and a tap 21 between stages 3 and 4. The output line is connected to a switch 25 which switch can select either one of the taps 19, 20, 21 or 22. Ideally, the switch 25 is moved to the correct position to provide the proper amplification. For instance, if the line is 600 feet long, the switch 25 connects tap 20 to the output line 23.

With the present invention, in effect, the correct number of stages is automatically selected. The amplifier automatically adjusts to an approximation of the line length in a manner totally transparent to the user/installer. As will be seen in one embodiment, the stages of the amplifier are themselves self-limiting and in another embodiment, switching occurs.

CURRENTLY PREFERRED EMBODIMENT

Referring to FIG. 4, the currently preferred embodiment of the amplifier of the present invention is shown. The amplifier receives an input on line 30 and provides an output on line 31. The amplifier comprises four substantially identical stages 32, 33, 34 and 35 and a biasing circuit 36. The stages are cascaded (series connection) and are AC coupled through capacitors such as capacitor 53 connecting stage 32 to stage 33.

Each stage comprises a pair of pnp transistors 40 and 41 connected in a long tailed amplifier/limiter stage with inverting gains. The transistor 40 is connected in a common emitter gain configuration and receives the input signal from line 30 on its base terminal. The base terminal is coupled to ground or a reference potential through a resistor 77. The collector terminal is coupled to a negative supply (e.g., −12 V) through a resistor 52. The collector terminal provides an output for the next stage. The emitter terminal of transistor 40 is coupled to a positive supply (e.g., +5 V) through resistor 42. Resistors 44 and 45 and capacitor 46 act to shape frequency response. The transistor 41 with its common base configuration has its emitter terminal coupled to the positive supply through resistor 43 and its collector terminal coupled to the negative supply through resistor 50. The base terminal 48 of transistor 41 is coupled to ground through resistor 49.

The transistor 40 provides amplification. Transistor 41 shares the bias current from resistors 42 and 43 and acts to give symmetric and controlled limiting of current shared with transistor 40. The resistor 44 and particularly the resistor 45 and capacitor 46 develop the higher frequency emphasis discussed above. For the Ethernet case shown, preset amplification is provided for both the 5 MHz and 10 MHz signals. The particular limiting mechanism which occurs for the stages of FIG. 4 permits, for example, additional amplification of the 10 MHz signal even when the 5 MHz signal has reached its preset limit.

In the currently preferred embodiment, a modest gain per stage is employed (i.e., 2 to 2.5). The stages receiving the limiting voltage as an input provide unity gain for all frequencies. The values of the resistors 42, 43, 44, 45 and the value of capacitor 46 are selected to ensure symmetrical limiting which has been found to be needed for correct data recovery, since propagated asymmetry undermines equalization.

The specific component values and transistors used for the stages are set forth in FIG. 4 for stage 33.

The biasing circuit 36 is used to control the effects of the offset transients encountered at the start of each packet of data. This circuit is driven by the complement of a carrier detect signal on line 55.

In operation, assume that the input signal on line 30 is a 1 V signal (at 5 MHz). Stage 32 amplifies this signal to the 2 V level and this signal is then passed on to stage 33. The 2 V level saturates stage 33 and this stage and the subsequent stages provide unity gain to the signal. If the signal on line 30 (again considering the 5 MHz component) is for example 0.125 V, it is amplified to 0.25 V by stage 32, to 0.5 V by stage 33, to 1 V by stage 34 and to 2 V before being coupled to the output line 31. Thus the amplifier of FIG. 4 amplifies an input signal in the range of 0.125 V to 2 volts, to 2 volts. If it is assumed that the input signal to a length of twisted pair line is up to 1200 feet, the amplifier automatically provides the correct amplification without the line length being known. This allows one "standard" amplifier to be used for different line lengths with the installer not needing to know the line length or needing to determine the line's characteristics.

The frequency emphasis is selected in the stages to match the transmission best approximation characteristics of a pre-set line segments of media. Thus, the frequency would be different for a given line in a "Token Ring" network as opposed to an "Ethernet" network.

ALTERNATE AMPLIFIER STAGES

Referring to FIG. 7, another stage for the amplifier of FIG. 4 is shown. The stage receives an input on line 87 and provides an output on line 88. The stage comprises a pair of pnp transistors 89 and 90 connected in a long-tailed pair. The transistor 89 is connected in a common emitter configuration and receives the input signal from line 87 on its base terminal. The emitter terminal of transistor 89 is coupled to a +5 V supply through resistor 91 and the collector terminal of this transistor is coupled to a −12 V supply. The transistor 90 with its common base configuration has its emitter terminal coupled to the +5 V supply through a resistor 93 and its collector terminal coupled to the −12 V supply through a resistor 97. The base terminal of transistor 90 is coupled to a reference potential through a 100 ohm resistor.

The transistor 90 provides amplification and steers DC current through the transistor 89 via the resistor 94. The resistor 94 and particularly, the resistor 95 and capacitor 96 develop the higher frequency emphasis discussed above. The circuit element values are chosen such that transistor 90 operates from cut-off to where it can carry all the bias current from the resistors 91 and 93. This action gives smooth amplitude limiting.

FIG. 3 shows another alternate stage which may be used for the stages shown in FIG. 4. This stage uses an MOS transistor 61. The emphasis is determined by the resistor 62 in conjunction with the resistor 64 and inductor 63. The self-limiting feature of this stage is obtained through the diodes 60 in the feedback path.

FIG. 5 shows another embodiment of a single stage. This embodiment uses the npn transistor 65 with the emphasis being determined by the resistor 67 in conjunction with the resistor 68 and capacitor 69. The self-limiting feature is provided by the clipping occurring through diodes 66 at the output of this common collector configuration.

ALTERNATE EMBODIMENT OF THE PRESENT INVENTION

Referring to FIG. 6, the alternate embodiment again includes four identical stages in an amplifier identified as stages S1, S2, S3 and S4. The input on line 70 is capacitor coupled to the input stage S1. The remaining stages are each coupled in cascade providing an output on line 71. The stage S1 comprises a transistor 72 connected in a common emitter configuration. Each stage includes an RC network comprising resistor 73 and a capacitor 74 which is selectively coupled to ground through a switch such as switch 75 (SW1) for stage S1. When the switch 75 is in its open position, stage 1 provides substantially unity gain for all frequencies of interest. When the switch 75 is closed a gain of approximately 6 dB is provided for the 5 MHz signal and higher gain (e.g., 9 dB) for the 10 MHz signal. Thus, as can be seen from FIG. 6, an input signal to each of the stages can either be amplified with the correct high frequency emphasis or the input signal can simply pass through the stage without being amplified depending on the switch position.

Implicit in the operation of amplifiers discussed above, including the amplifier of FIG. 6 is that the input signal to the amplifier is to be restored to its original amplitude and that original amplitude is known, for example, 2 V at 5 MHz. The fact that the original amplitude of the signal is known is used in the embodiment of FIG. 6 to, in effect, estimate the length of the line through which the signal passed before reaching the amplifier. The a.c. input signal on line 70 is coupled to an input comparator 80 and compared to a predetermined voltage. For the Ethernet embodiment discussed here, the peak value of the 5 MHz component of an Ethernet signal on line 70 is compared to 2 V, this being the peak amplitude of the original 5 MHz component of the signal. If the results of this comparison show that the signal is substantially unattenuated (e.g., greater than 1 V) no output is provided from the comparator 80. In this case, none of the switches S1 through S4 are closed and the input signal on line 70 passes to the output line 71 without amplification. Next consider the case where the input signal to the amplifier and comparator 80 is less than 0.125 V, in this case a signal is provided by the comparator on line 81 and all the switches S1 through S4 are closed providing amplification by all the stages. If the signal is 0.125 V or greater but less than 0.25 V then a signal appears on line 82 and switches S1, S2 and S3 are closed. Similarly, if the signal is 0.25 V or greater but less than 0.5 V a signal appears on line 83 and the switches SW1 and SW2 are closed. Finally, if the signal is between 0.5 V and 1 V a signal occurs on line 84 and switch SW1 is closed. In this manner, the proper amplification is provided.

The comparator 80 of FIG. 6 can be used with the arrangement of FIG. 2 where the stages are tapped (not self-limiting) and an output taken at the output of the appropriate stage.

A method implemented by the present invention comprises the steps of first measuring the a.c. amplitude of a signal transmitted over a twisted pair line and comparing the results of this measurement with the amplitude of the signal that was transmitted (this is assumed to be known). Then sufficient gain is provided in an amplifier (with the desired frequency emphasis) to restore the signal to its original amplitude and frequency spectrum content. In an Ethernet signal the measurement, which is needed to provide the correct gain, can be done on the header of a packet by examining the 5 MHz component. This gives time for the measuring and adjusting (e.g., setting of gains) to occur before the data appears. The gain, once determined, is used for the entire block of data and reestablished for each header.

Thus, an amplifier has been described which is particularly suitable for amplifying a data carrying signal in a network such as an Ethernet network where the signal is transmitted over a twisted pair telephone line. The amplifier's gain is in effect dynamic in that it serves as a function of the magnitude of the input signal. This, among other advantages, provides automatic compensation as the lines impedance changes-for example, with temperature and humidity.

We claim:

1. An amplifier for amplifying a signal transmitted over a line, where the line attenuates higher frequencies more than lower frequencies:
   a plurality of cascaded stages, each stage including predetermined amplification with higher frequency emphasis;
   each stage further being able to pass an input signal to the stage's output with substantially no attenuation when the input signal to that stage is of a predetermined level.

2. The amplifier defined by claim 1 wherein each stage includes a first transistor and second transistor coupled in a long tailed pair.

3. The amplifier defined by claim 1 wherein each stage includes diodes which prevent amplification of an input signal to that stage once the input signal reaches the predetermined level.

4. An amplifier comprising:
   a plurality of stages coupled in series such that the output of one stage is amplified by the next stage in the series;
   each of the stages having a gain-frequency response favoring higher frequencies so long as the signal being applied to the input of that stage is below a predetermined level, and each stage having a substantially unity gain when the signal applied to that stage is above the predetermined level.

5. The amplifier defined by claim 4 wherein each stage includes circuitry which causes the stage to self-limit its gain when the input signal is above the predetermined level.

6. The amplifier defined by claim 5 wherein each stage includes a pair of transistors which are biased so as to cause the current in one of the transistors to flow through the other of the transistors when the predetermined level is reached.

7. The amplifier defined by claim 5 wherein each of the stages includes diodes to provide the self-limiting.

8. An amplifier comprising:

a plurality of stages coupled in cascade;

each stage having a self-limiting mode entered into when the level of the input signal to the stage reaches a predetermined level, below this level each stage providing a predetermined gain-frequency response which provides higher frequency emphasis;

each of the stages once entering the mode having a substantially unity gain-frequency response.

9. An amplifier for receiving an input signal and amplifying it comprising:

a plurality of stages coupled in cascade;

each stage having a switch means associated with it for selecting a predetermined gain-frequency response which favors higher frequencies or a unity gain response;

comparator means coupled to receive the input signal to the amplifier for controlling the switching means of the stages such that more of said stages are selected as the input signal to the amplifier decreases in magnitude.

10. The amplifier defined by claim 9 wherein the comparator means compares the input signal to a predetermined level.

* * * * *